United States Patent [19]

Rideout et al.

[11] Patent Number: 5,069,561

[45] Date of Patent: Dec. 3, 1991

[54] MONOLITHICALLY INTEGRATED RIDGE WAVEGUIDE SEMICONDUCTOR OPTICAL PREAMPLIFIER

[75] Inventors: William C. Rideout, Townsend; Roger P. Holmstrom, Wayland; Elliot Eichen, Arlington; William Powazinik, Marlborough; Joanne LaCourse, Hudson; John Schlafer, Wayland; Robert B. Lauer, Stow, all of Mass.

[73] Assignee: GTE Laboratories Incorporated, Waltham, Mass.

[21] Appl. No.: 557,276

[22] Filed: Jul. 24, 1990

[51] Int. Cl.⁵ .................................. H01S 3/19
[52] U.S. Cl. ........................... 385/14; 372/50
[58] Field of Search ............ 350/96.11–96.14, 350/96.17; 357/16, 17, 19; 372/43–47, 50

[56] References Cited

U.S. PATENT DOCUMENTS

| | | | |
|---|---|---|---|
| 4,653,058 | 3/1987 | Akiba et al. | 357/19 X |
| 4,805,184 | 2/1989 | Fiddyment et al. | 350/96.12 |
| 4,823,352 | 4/1989 | Sugimoto | 372/45 |
| 4,847,665 | 7/1989 | Mand | 357/16 |
| 4,872,180 | 10/1989 | Rideout et al. | 372/99 |
| 4,895,615 | 1/1990 | Muschke | 350/96.12 X |

OTHER PUBLICATIONS

"Semiconductor Laser Optical Amplifiers for use in Future Fiber System" by O'Mahoney, Journal of Lightwave Tech., vol. 6, No. 4, Apr. 1988.
"Ultra-Low-Reflectivity Semiconductor Optical Amplifier Without Antireflection Coatings" by Rideout et al., Elec. Lettrs. 1/4/1990, vol. 26, No. 1.
"Monolithic Integration of 1.5 μm Optical Preamplifier etc" by Wake et al., CPDP 18-2, pp. 636–637.
Marcuse, "Reflection Loss of Laser Mode from Tilted End Mirror", J. of Lightwave Tech., vol. 7, No. 2, Feb. 1989, IEEE.

*Primary Examiner*—Akm Ullah
*Attorney, Agent, or Firm*—Victor F. Lohmann, III

[57] ABSTRACT

A monolithically integrated optical preamplifier comprises an amplifying region, an optical detection region for detecting amplified light, and an optically transparent and electrically insulating isolation region interposed between the amplifying and optical detection regions. The amplifying region achieves reduced facet reflectivity by being designed to have a large spot size, single-traverse mode waveguide amplifier oriented at an angle with respect to a crystal plane through the preamplifier. The isolation region is preferably an air gap.

12 Claims, 2 Drawing Sheets

MONOLITHICALLY INTEGRATED RIDGE WAVEGUIDE SEMICONDUCTOR OPTICAL PREAMPLIFIER

FIELD OF THE INVENTION

This invention relates to semiconductor optical amplifiers and, more particularly, to a monolithically integrated semiconductor optical preamplifier.

CROSS-REFERENCE TO RELATED APPLICATIONS

This patent application is copending with an application entitled "Monolithically Integrated Semiconductor Optical Preamplifier," Ser. No. 07/521,205, filed May 9, 1990 by the same inventors and assigned to the same assignee as the present application.

BACKGROUND OF THE INVENTION

Semiconductor optical amplifiers will play a key role in future wide band optical transmission and optical signal processing systems when employed in an optical preamplification system. In particular, a semiconductor amplifier coupled to an optical detector operates as an optical preamplifier, amplifying the entering optical signal and then converting it to an electrical signal. For very high speed systems, such as those with a data rate greater than a few GBit/sec or a bandwidth greater than a few GHz, optical preamplification offers better performance in terms of signal-to-noise ratio than electrical preamplification, which initially detects the optical signal and then amplifies the detected signal electrically.

Semiconductor optical amplifiers are semiconductor lasers operating below threshold and include low reflectivity facets. Defining $P_{in}$ as the power (in watts) of the input optical signal and $P_{out}$ as the power (in watts) of the signal exiting the amplifier, the input and output powers of the amplifier are related by $$P_{out} = G\, P_{in} \tag{1}$$

The amplifier gain G can be written in terms of the input facet power reflectivity $R_1$, the output facet power reflectivity $R_2$, the single pass gain through the amplifier $G_s$, and the single pass phase shift through the amplifier $\beta$ as $$G = \frac{(1 - R_1)(1 - R_2)G_s}{[1 - (R_1 R_2 G_s)^{\frac{1}{2}}]^2 + 4(R_1 R_2 G_s)^{\frac{1}{2}}\sin^2\beta}.$$

Clearly, the facet reflectivity can significantly impact the performance of optical amplifiers.

The single pass gain, which can be greater than 30 dB, depends upon the materials, geometry, and doping of the epitaxial layers, the injection current, and the non-radiative losses. However, the actual (or useful) gain from the amplifier is limited by Fabry-Perot resonances, caused by reflections from each facet of the cavity. From a systems perspective, an acceptable amount of ripple in the gain due to these resonances is generally considered to be $\leq 3$ dB; this allows the amplifier (called a Traveling Wave Amplifier to distinguish it from an amplifier with large resonances, called a Fabry-Perot Amplifier) to be used with conventional semiconductor lasers without preselection for specific wavelengths, and without requiring extreme temperature stabilization of both laser and amplifier. FIG. 1 illustrates the problem of finite reflectivity by showing the gain versus wavelength for two different values of the single pass gain and two different values of the reflectivity. In order to achieve low gain ripple, FIG. 1 shows in curve 11 that the gain for the device with an effective reflectivity $R_e = 0.5\%$ (where $R_e = (R_1 R_2)^{\frac{1}{2}}$) is limited to approximately 15 dB. The same device with a lower effective reflectivity of $R_e = 0.05\%$ can achieve about ten times as much gain, which is approximately 25 dB as shown by curve 13. The other characteristic curves 10 and 12 are for devices with $G = 15$ dB, $R_e = 0.05\%$ and $G = 25$, $R_e = 5\%$ respectively.

Conventional approaches to reducing facet reflectivity have focused on the techniques of anti-reflection (AR) coating the facet with a single or multiple layer thin film and tilting the amplifying channel at an angle with respect to the amplifier facet. AR coatings with the required reflectivity ($\sim 10^{-4}$) on both facets have been fabricated but with great difficulty. A viable way to fabricate conventional semiconductor optical amplifiers has been to combine tilted facets with AR coatings. Another approach presented by Rideout et al. in U.S. Pat. No. 4,872,180 issued Oct. 3, 1989 avoids the use of AR coatings by fabricating an amplifier to have the following features: (1) a bulk regrown end cap region formed at both of the major facet surfaces of the amplifier, (2) an angled waveguide geometry, and (3) index-matching the end cap regions to the waveguide.

A semiconductor amplifier coupled to an optical detector operates as an optical preamplifier by amplifying the entering optical signal and then converting it to an electrical signal. In comparison, electrical preamplification operates by initially detecting the optical signal and then electrically amplifying the detected signal. Operational results of both types of preamplifiers indicate that optical preamplification offers better performance in terms of signal-to-noise ratio for very high speed systems applications such as those with a data rate greater than a few GBit/sec or a bandwidth greater than a few GHz. Consequently, semiconductor optical amplifiers will emerge as integral components in future wide-band optical communication and signal processing systems when optical preamplification is desired.

The copending application entitled "Monolithically Integrated Semiconductor Optical Preamplifier" discloses a monolithically integrated semiconductor optical preamplifier comprising an optical amplifier electrically isolated from an optical detector by a regrown isolation region consisting of an insulating material. The index of refraction of this insulating material is matched to the refractive index of the material constituency of the amplifier region in order to reduce the output facet reflectivity of the amplifier.

OBJECTS OF THE INVENTION

It is a principal object of the present invention to obviate the above-noted and other disadvantages of the prior art.

It is a further object of the present invention to provide a monolithically integrated optical preamplifier which achieves reduced facet reflectivity at the amplifier output face while avoiding complex fabrication techniques related to the regrowth of an index-matching material system between the amplifier and detector, and therefore providing simpler fabrication and greater reliability.

It is a further object of the present invention to provide a preamplifier whose waveguiding amplifier structure achieves ultra-low-reflectivity without requiring anti-reflection coatings.

SUMMARY OF THE INVENTION

The present invention is directed to a monolithically integrated optical preamplifier comprising an amplifying region, an optical detection region for detecting amplified light, and an optically transparent and electrically insulating isolation region interposed between the amplifying and optical detection regions. The isolation region is preferably an air gap. The amplifying region includes a large spot size, single-traverse mode waveguide amplifier oriented at an angle with respect to a crystal plane through the preamplifier.

DETAILED DESCRIPTION OF THE INVENTION

The copending patent application entitled "Monolithically Integrated Semiconductor Optical Preamplifier" filed by the same inventors as the present application concerns a monolithically integrated preamplifier which reduces the reflectivity of the amplifier/detector interface by forming an isolation region of a regrown material between the amplifier and detector regions. This isolation region is index-matched to at least the amplifier region. The present invention as shown in FIG. 2 is concerned with reducing facet reflectivity by focusing on the design of the amplifier rather than the formation of an index-matching isolation region, thereby avoiding the fabrication steps necessary for the growth of an index-matching material system between the amplifier and detector.

Figure 1:
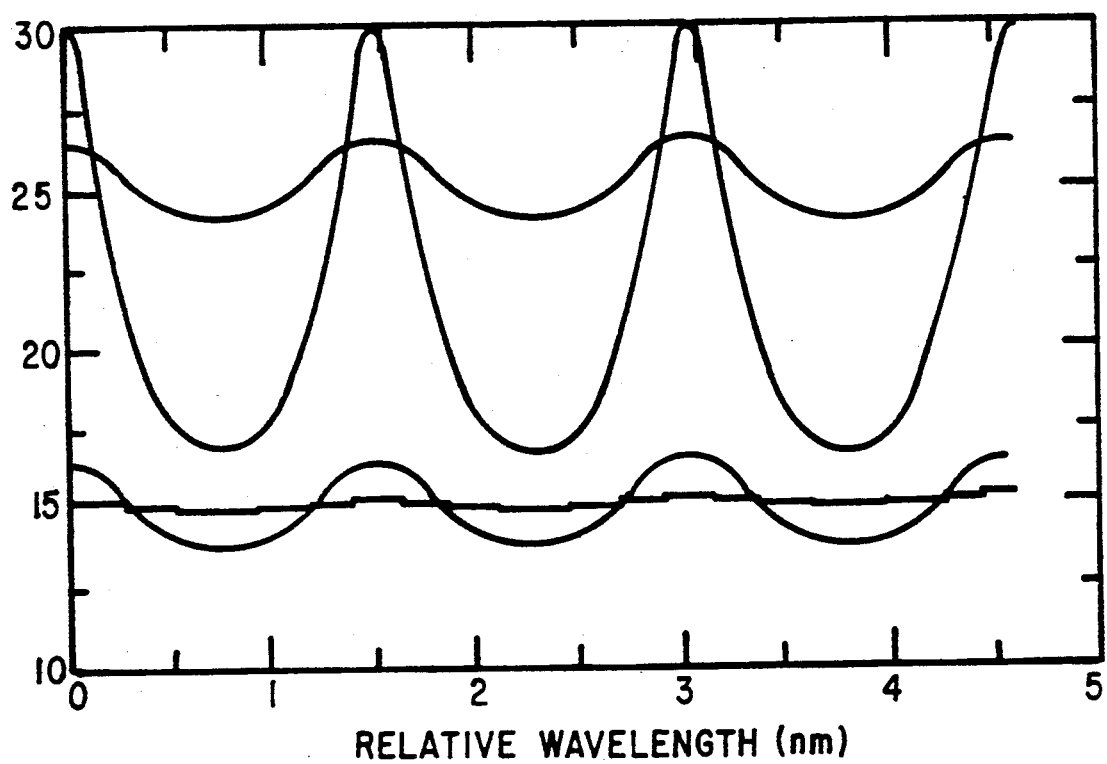
FIG. 1 shows gain as a function for wavelength for different values of single pass gain and reflectivity in a conventional traveling wave amplifier.
Figure 2:
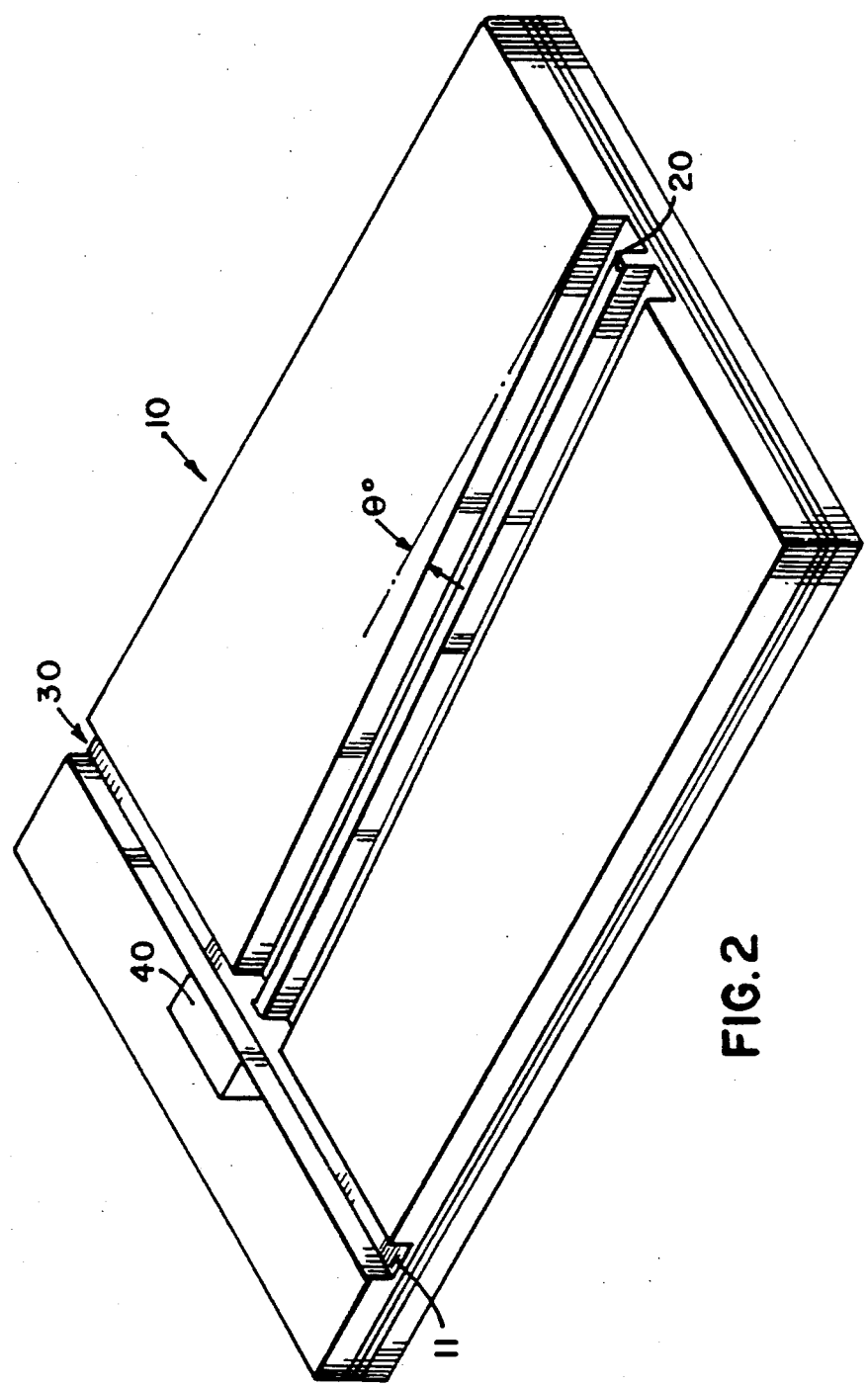
FIG. 2 is an upper perspective view of a monolithically integrated ridge waveguide semiconductor optical preamplifier according to the present invention.

The integrated optical preamplifier 10 illustrated in FIG. 2 is comprised of a single-transverse mode tilted-stripe ridge waveguide amplifier 20 integrated with a semiconductor optical detector 40 that is electrically isolated from the amplifier by an electrically insulating isolation region 30.

Although region 30 is an air gap in FIG. 2, region 30 may be any optically transparent and electrically insulating material, such as polyimide. The isolation region 30 of the present invention is distinguished from the regrown region in the copending application "Monolithically Integrated Semiconductor Optical Preamplifier" in that the regrown material need not be index-matched to the amplifying region to achieve reduced reflectivity. Rather, as will be explained hereinafter, the particular design of the amplifying region according to the present invention controls the reduction in reflectivity.

As shown in FIG. 2, the waveguide is oriented at an angle $\theta$ with respect to the crystal axis through the preamplifier structure. The amplified light propagating into region 30 strikes the input face of detector 40 at such an angle that any reflected light propagating back into region 30 will be laterally displaced from amplifier 20 when it reaches the facet plane 11. This misalignment between amplifier 20 and the beam spot formed on facet plane 11 is significant because it prevents the reflected wavefront from being coupled back into the amplifier.

During operation, the single-transverse mode tilted-stripe ridge waveguide amplifier 20 is forward-biased and the photodetector 40 is reverse-biased. Incoming light is amplified by the ridge waveguide 20 with very little residual Fabry-Perot ripple, and the amplified light then exits into the air gap 30 where it propagates before entering the photodetector region 40, producing a detected electrical signal.

The air gap serves to electrically isolate the forward-biased amplifier from the reverse-biased detector. The use of a simple air gap between the amplifier and the detector has two important advantages: the device processing is greatly simplified, and good electrical isolation between the amplifier and the detector becomes much easier to achieve. These advantages enable fabrication of a more reliable, lower cost preamplifier.

Unlike the regrown isolation region of the preamplifier in the copending application entitled "Monolithically Integrated Semiconductor Optical Preamplifier," Ser. No. 07/521,205, the isolation region of the preamplifier in the present invention can remain an air gap and therefore need not be index-matched to the amplifier because the amplifier itself has been structurally and materially designed to reduce the residual facet reflectivity. The reduction in reflectivity for an amplifier structure due to the design of the waveguide is discussed by Rideout et al. in "Ultra-Low Reflectivity Semiconductor Optical Preamplifiers without Anti-Reflection Coatings", Electron. Lett., 26, pp. 36-37 (1990), and is explained below with regard to the present invention shown in FIG. 2.

The low reflectivity of preamplifier 10 according to the present invention is achieved by combining the aforementioned advantage of an angled amplifier with the design features of (1) a geometry which allows amplification of only the lowest order spatial mode and (2) a large spot size. The first feature allows the amplifier to operate so that light travelling down the waveguide in the lowest order spatial mode is amplified, while any light travelling in a higher order mode is rapidly attenuated because the waveguide is designed not to propagate these higher order modes. When the light from the lowest order mode strikes the facet 11, the majority of the light (~66%) passes out into the air gap 30 to be detected by the photodetector 40. The remaining 34% of the light which is reflected back into the amplifier waveguide consists of various modes, but since the waveguide has been designed to allow only one spatial mode, any light that is scattered into any other mode besides the lowest order mode is rapidly attenuated and has no effect on the amplifier's performance. Consequently, the reflectivity of the present amplifier is set only by the reflectivity of the lowest order mode. This attenuation of higher order modes is in contrast to conventional tilted-facet amplifiers in which the waveguides allow more than one spatial mode. It is important to note that while conventional tilted facets can yield very low reflectivities for the lowest order mode, they usually have much higher reflectivities for higher order waveguide modes, which can explain the relatively poorer performance achieved by conventional tilted-stripe amplifiers.

The reflectivity of an amplifier which suppresses higher-order modes can be reduced to below $10^{-4}$ by using a waveguide with a large spot size such as a ridge waveguide, as shown in the theoretical work by Marcuse in Journal of Lightwave Technology. 7,336 (1989).

In one particular embodiment of this device shown in FIG. 2, the amplifier would be fabricated as a ridge waveguide oriented at 7° from the crystal plane, with a ridge width of 2.75 microns. The ridge would consist of p-doped InP, while underneath the ridge would be a so-called stop etch layer of InGaAsP with a wavelength of 1.06 microns, followed by the active layer of InGaAsP with a wavelength of 1.31 microns. The thicknesses of these two layers would be 0.15 microns and 0.25 microns, respectively, which is sufficiently thick to ensure single spatial mode performance. A high speed photodetector could be formed by etching an area of the wafer and regrowing undoped InGaAs. The air gap would be etched between the ridge and the regrown InGaAs to a width of 2 microns and to a depth well below the active layer. The high speed photodetector could then be finished by metallizing a small area of the InGaAs and etching a mesa structure to reduce the device capacitance.

The above embodiment should serve only as an exemplary structure since other modifications within the scope of the present invention should be apparent to those skilled in the art. For example, an entirely different material system such as GaAs could be used to make a preamplifier which operates at different wavelengths. Furthermore, an inverted rib waveguide having a large spot size and a single spatial mode (the tilt is still required) may be used instead of a ridge waveguide. A high speed photodetector such as a heterojunction photodetector may be fabricated in which no regrowth of InGaAs would be required. Additionally, as noted before, the gap between the amplifier and the photodetector need not be an air gap, but could be any electrically insulating material such as polyimide.

What has been shown and described herein is a novel monolithically integrated optical preamplifier using a large spot size, single-transverse mode tilted-stripe ridge waveguide amplifier that is electrically isolated from an optical detection region by ar electrically insulating and optically transparent isolation region that is preferably an air gap. The angled waveguide amplifier achieves extremely low facet reflectivities without requiring anti-reflection coating of the facets or formation of an index-matching regrowth isolation region between the amplifier and detector. Consequently, the present invention offers good electrical isolation between the amplifier and detector while avoiding complex processing, with the simplified structure having reliability and inexpensive packaging costs.

What is claimed is:

1. A wide-bandwidth monolithically integrated optical preamplifier for amplifying and detecting an input optical signal, comprising:

an amplifying region including a large spot size, single-transverse mode traveling wave amplifier having an active layer for receiving said input signal, wherein said amplifier is oriented at an angle with respect to a crystal plane through said preamplifier;

an optical detection region having an absorbing layer for detecting said amplified light; and an air gap electrical isolation region interposed between said amplifying and optical detection regions, and having a depth below the active layer of said amplifier.

2. The preamplifier as recited in claim 1 wherein said amplifying region includes
a ridge waveguide oriented at 7° from said crystal plane.

3. The preamplifier as recited in claim 2 wherein
said ridge waveguide includes an active layer of InGaAsP emitting light at a wavelength of 1.31 microns.

4. The preamplifier as recited in claim 1 wherein said optical detection region includes
a photodetector.

5. The preamplifier as recited in claim 4 wherein
said photodetector consists of regrown InGaAs.

6. The preamplifier as recited in claim 3 wherein
said air gap isolation region has width of 2 microns.

7. A wide-bandwidth monolithically integrated optical preamplifier for amplifying and detecting an input optical signal, comprising:

an amplifying region including a large spot size, single-transverse mode traveling wave amplifier having an active layer for receiving said input signal, wherein said amplifier is oriented at an angle with respect to a crystal plane through said preamplifier;

an optical detection region having an absorbing layer for detecting said amplified light; and an optically transparent and electrically insulating isolation region interposed between said amplifying and optical detection regions, and having a depth below the active layer of said amplifier.

8. The preamplifier as recited in claim 7 wherein said amplifying region includes
a ridge waveguide oriented at 7° from said crystal plane.

9. The preamplifier as recited in claim 8 wherein
said ridge waveguide includes an active layer of InGaAsP emitting light at a wavelength of 1.31 microns.

10. The preamplifier as recited in claim 7 wherein said optical detection region includes
a photodetector.

11. The preamplifier as recited in claim 10 wherein said photodetector consists of regrown InGaAs.

12. The preamplifier as recited in claim 9 wherein said isolation region has a width of 2 microns.

* * * * *